(12) United States Patent
Wu

(10) Patent No.: US 7,276,741 B2
(45) Date of Patent: Oct. 2, 2007

(54) LIGHT EMITTING DIODE PACKAGE WITH COAXIAL LEADS

(76) Inventor: Jiahn-Chang Wu, No. 15, Lane 13, Alley 439, Her-Chiang St., Chutung, Hsin-Chu (TW) 310

( * ) Notice: Subject to any disclaimer, the term of this patent is extended or adjusted under 35 U.S.C. 154(b) by 0 days.

(21) Appl. No.: 11/728,610

(22) Filed: Mar. 27, 2007

(65) Prior Publication Data

US 2007/0170456 A1 Jul. 26, 2007

Related U.S. Application Data

(62) Division of application No. 11/183,076, filed on Jul. 18, 2005, now Pat. No. 7,205,579.

(51) Int. Cl.
*H01L 33/00* (2006.01)
*H01L 27/15* (2006.01)
*H01L 31/12* (2006.01)
(52) U.S. Cl. .......................................... 257/99; 257/80
(58) Field of Classification Search ........... 257/80–103
See application file for complete search history.

(56) References Cited

U.S. PATENT DOCUMENTS

2003/0006423 A1* 1/2003 Loh et al. ...................... 257/99
2004/0188698 A1* 9/2004 Ishimura ...................... 257/99

* cited by examiner

*Primary Examiner*—Cuong Nguyen
(74) *Attorney, Agent, or Firm*—H.C. Lin Patent Agent

(57) ABSTRACT

The leads of a light emitting diode are made coaxial. The inner lead protrudes lower than the outer lead. The package is inserted into a spongy display panel for power supply. The display panel has three layers: a lower conducting layer for contacting said inner lead and a top conducting layer for contacting said outer layer, and an insulating layer between the top and the bottom layer. For LED with a bottom electrode and a top electrode, the LED can be mounted on the planar tops of the inner lead and the top electrode wire bonded to the outer lead, or the LED can be mounted on the side surface of the inner lead and the top electrode wire bonded to the outer lead. For LED with two bottom electrode, the LED electrodes can straddle over the planar tops of the inner lead and the outer lead, or the LED electrodes can straddle over the telescopic side surfaces of the two leads.

1 Claim, 5 Drawing Sheets

LIGHT EMITTING DIODE PACKAGE WITH COAXIAL LEADS

This application is a division of application Ser. No. 11/183,076, filed Jul. 18, 2005, (now U.S. Pat. No. 7,205,579)

BACKGROUND OF THE INVENTION

1. Field of the Invention

This invention relates to light emitting device, particularly to the package of light emitting device (LED) or laser diode (LD).

2. Brief Description of Related Art

FIG. 1 shows a prior art package for a LED. A LED 10 chip is mounted in a recess at the top of lead 11 of the LED package, which is in contact with the bottom electrode of the LED 10. The top electrode of the LED 10 is wire bonded to a second lead 12 of the package with a metal wire 14. The top portions of the leads 11, 12 are imbedded in protective glue 13.

When such a package is mounted on a planar display board, the board usually has printed wiring on the underside. The LED leads can only reach the printed wiring through plated through holes. When a customer changes the display panel pattern, a new printed wiring board must be furnished. Therefore, such a LED package lacks design flexibility for a display.

SUMMARY OF THE INVENTION

An object of this invention is to provide a LED package design flexibility in mounting on a display panel. Another object of this invention is to provide a LED package which can easily be removed and inserted into a mother board. Still another object of this invention is to save space between the LED leads.

These objects are achieved by providing the LEDs with coaxial leads. The coaxial leads are separated from each other by an insulating sleeve. For a LED with a bottom electrode, the LED can be mounted on top of the inner lead, or mounted on the side of the a protruded inner leads to change the direction of light emission. For a LED with two bottom electrodes, the two bottom electrodes can straddle over the planar tops of the two coaxial leads, or straddles over the two coaxial leads along their telescopic sides.

DETAILED DESCRIPTION THE INVENTION

Figure 1:
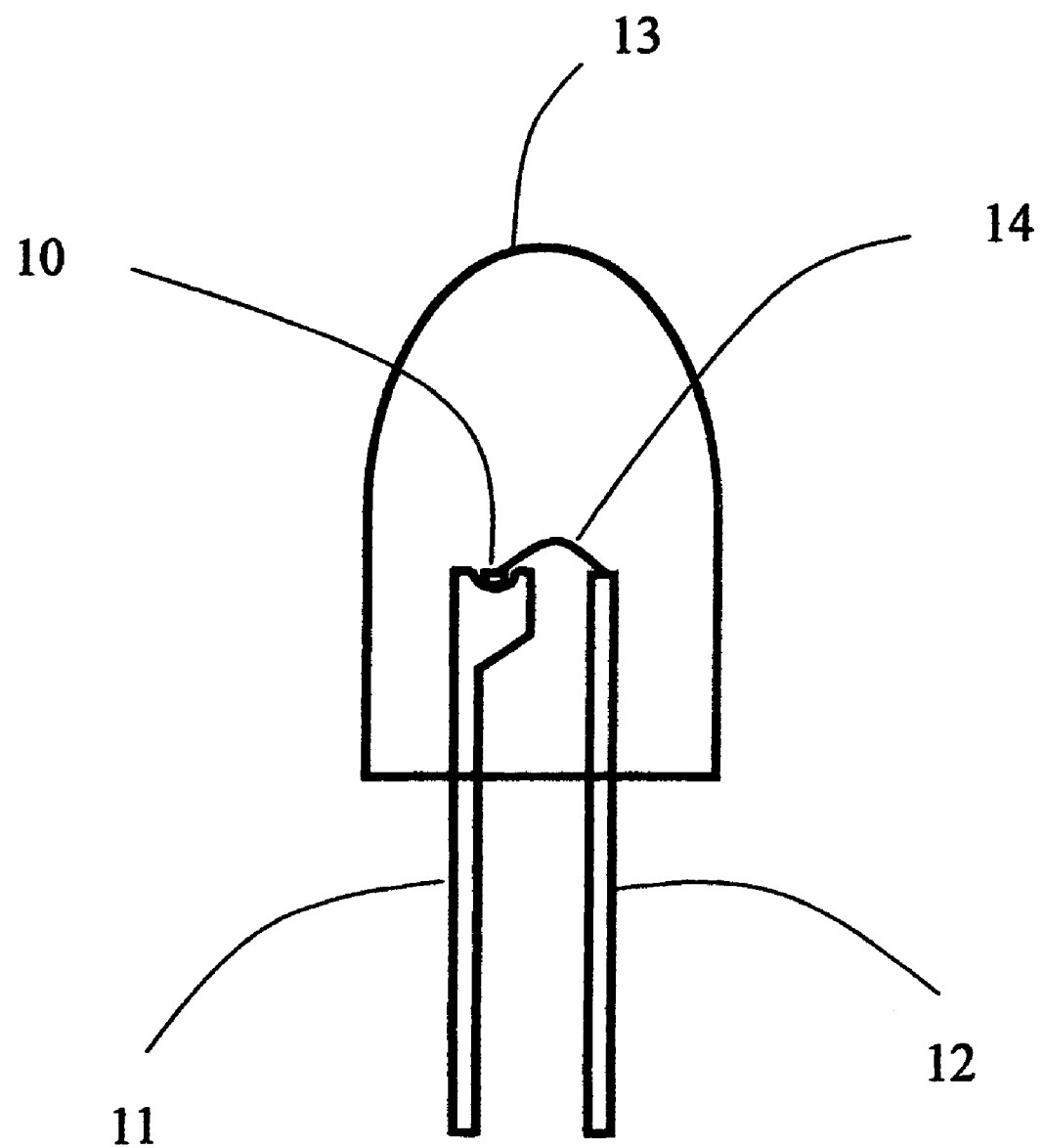
FIG. 1 shows a prior art LED package.
Figure 2:
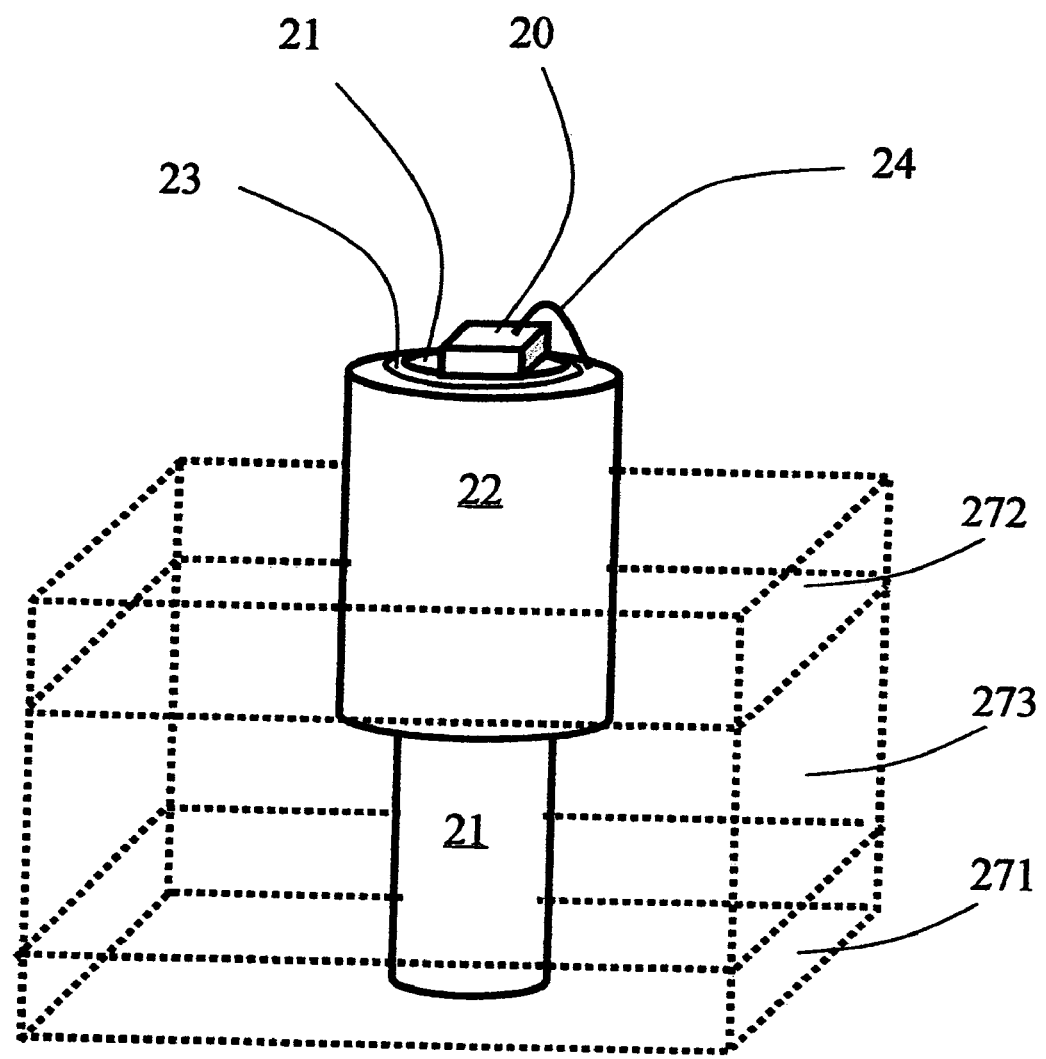
FIG. 2 shows a first embodiment of the present invention for a LED package with two coaxial leads.

FIG. 2 shows the basic structure of the LED package based on the present invention. The package has two concentric leads: an inner leads 21 and outer lead 22. The two concentric leads 21, 22 are separated by an insulating sleeve 23. Both the top surfaces of the two leads 21 and 22 are made planar. The LED chip 20 with a bottom electrode and a top electrode is mounted on top of the inner lead 21. The top electrode of the LED 20 is wire bonded to the outer lead 22 through a wire 24.

The dotted lines show how the LED package of the present invention is inserted into a display panel board. The bottom layer 271 of this dotted structure is a soft conducting layer, which supplies the first power source. The top layer 272 of this dotted structure is a soft conducting layer, which supplies the second power source. In between the bottom soft layer 271 and top soft layer 272 is a soft insulating layer 273. When the LED package is inserted into the display panel board, the inner lead 21 makes contact with the bottom layer 271 and the outer lead 22 makes contact with top layer 272. Thus, the LED 20 is energized. The soft conducting layer refers to conducting sponge, conducting rubber or metallic mesh. The soft insulating layer refers to glue, sponge, etc. The leads 21, 22 are selected from metal which can withstand repeated insertions.

Figure 3:
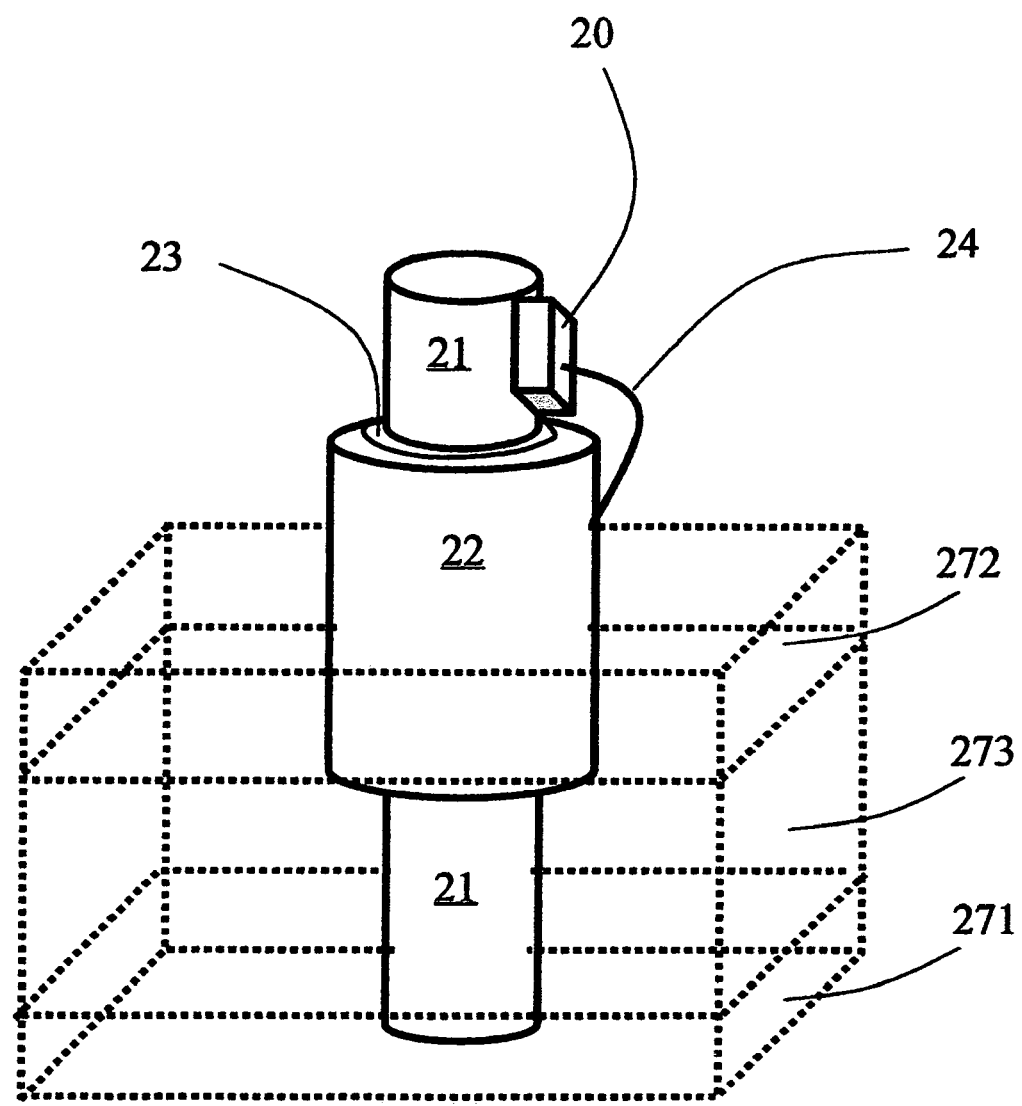
FIG. 3 shows a second embodiment of the present invention with coaxial leads and side-mount LED.

FIG. 3 shows a second embodiment of the present invention. The structure is similar to that in FIG. 2, except that the LED 20 is mounted on the side of a protruded inner lead 21. In this structure, the light emitted from the LED 20 is orthogonal to that emitted from that in FIG. 2. Other reference numerals refer to the corresponding parts in FIG. 2.

Figure 4:
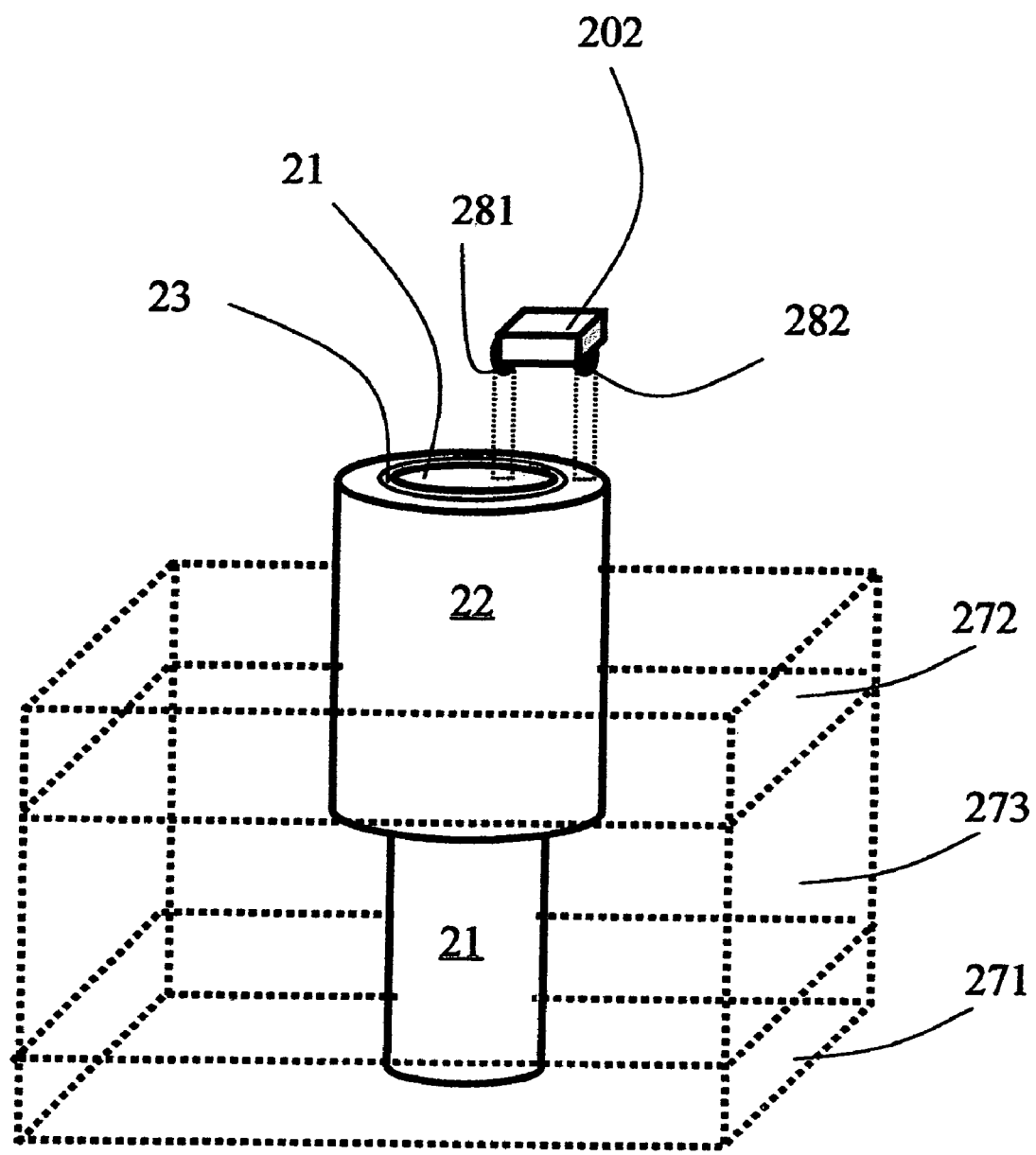
FIG. 4 shows a third embodiment of the present invention with coaxial leads for LED with two bottom electrodes.

FIG. 4 shows a third embodiment of the present invention. This structure is applicable to a LED 202 with two bottom electrodes with solder 281, 282. Both the top surfaces of the two leads 21 and 22 are made planar. These two electrodes straddle over the top of the inner leads 21 and the top of the outer lead 22 to make contacts. Other parts with the same reference numerals as that shown in FIG. 2 perform the same corresponding functions.

Figure 5:
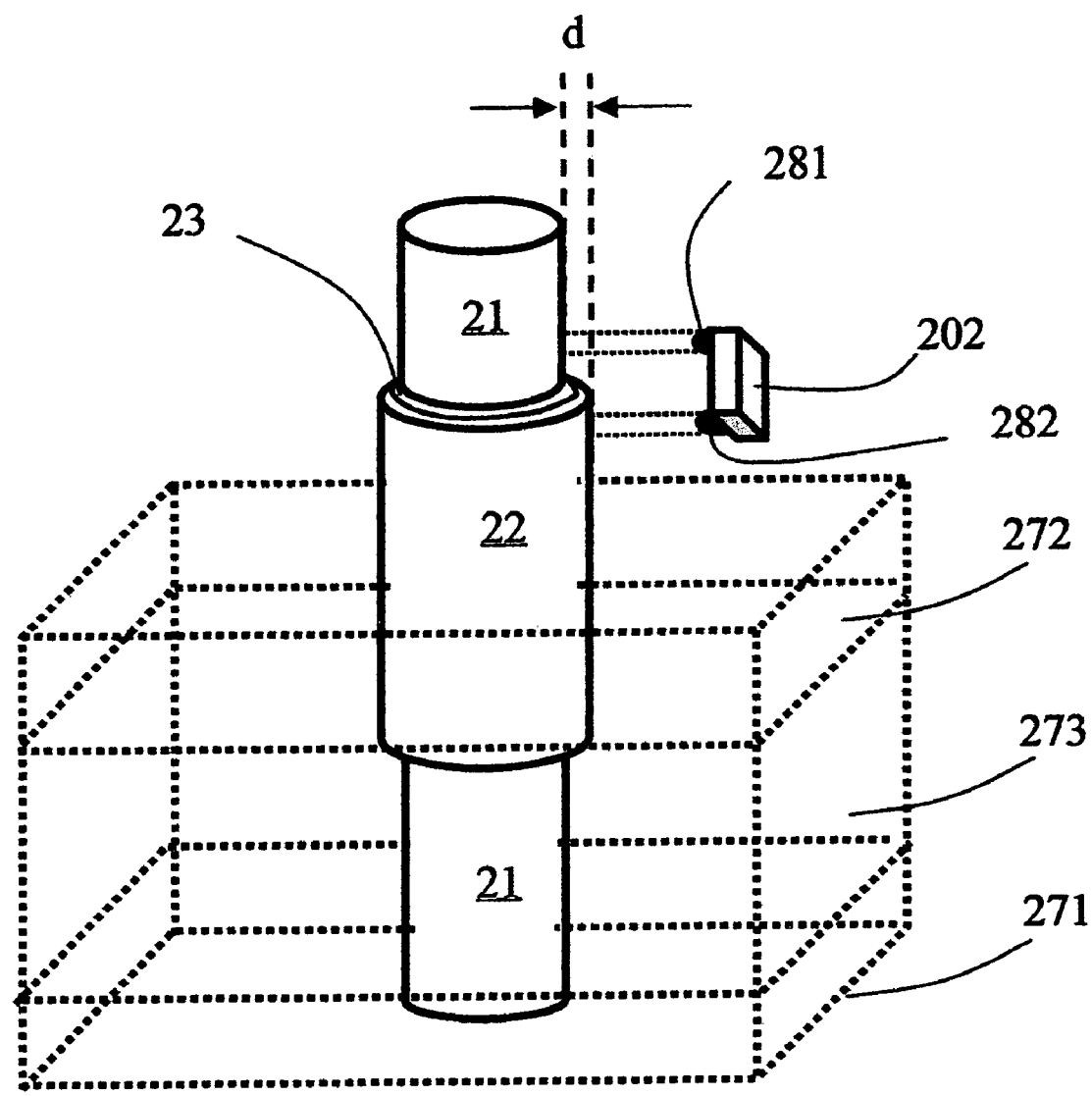
FIG. 5 shows a fourth embodiment of the present invention with coaxial leads for side-mount LED with two bottom electrodes.

FIG. 5 shows a fourth embodiment of the present invention. This application is applicable to a LED 202 with two bottom electrodes with solder 281, 282, but light emission orthogonal to that in FIG. 4. The coaxial leads has a telescopic inner lead 21 protruding over the inner lead 22. The LED 202 has soldered electrodes 281, 282 straddling over the inner coaxial lead 21 and the outer coaxial lead 22. Because the insulating layer 23 plus the outer lead 22 is made very thin with a thickness d, the soldered leads 281, 282 of the LED 202 are aligned along the vertical surfaces of the coaxial leads. Other parts with the same reference numerals as that in FIG. 2 perform the same corresponding functions.

While the preferred embodiments has been described, it will be apparent to those skilled in the art that various modification may be made in the embodiments without departing from the spirit of the present invention. Such modifications are all within the scope of the present invention.

The invention claimed is:

1. A light emitting diode (LED) package, comprising:
   a light emitting diode having a top electrode and a bottom electrode;
   two coaxial leads having an outer lead and an inner lead protruding below said outer lead; and
   an insulating layer separating said two coaxial leads, wherein said inner lead protrudes above said outer lead and said LED is side mounted on said inner lead and the top electrode of the LED is wire bonded to said outer lead.

* * * * *